US012690152B2

(12) United States Patent
Lin et al.

(10) Patent No.: US 12,690,152 B2
(45) Date of Patent: Jul. 21, 2026

(54) SERVER SYSTEM STORAGE SYSTEM STORAGE MODULE

(71) Applicant: Dell Products L.P., Round Rock, TX (US)

(72) Inventors: Yen-Hsing Lin, Datong District (TW); Te-Ming Liao, Taoyuan (TW); Ying-Hsien Tseng, Taipei (TW)

(73) Assignee: Dell Products L.P., Round Rock, TX (US)

( * ) Notice: Subject to any disclaimer, the term of this patent is extended or adjusted under 35 U.S.C. 154(b) by 182 days.

(21) Appl. No.: 18/768,197

(22) Filed: Jul. 10, 2024

(65) Prior Publication Data

US 2026/0020177 A1    Jan. 15, 2026

(51) Int. Cl.
H05K 7/14        (2006.01)
G06F 1/185       (2026.01)
G06F 1/187       (2026.01)

(52) U.S. Cl.
CPC .......... H05K 7/1409 (2013.01); G06F 1/185 (2013.01); G06F 1/187 (2013.01); H05K 7/1418 (2013.01); H05K 7/1487 (2013.01)

(58) Field of Classification Search
CPC .. H05K 7/1409; H05K 7/1418; H05K 7/1487; H05K 7/1402; H05K 7/1415; H05K 7/1429; G06F 1/185; G06F 1/187; G06F 1/184; G06F 1/186
See application file for complete search history.

(56) References Cited

U.S. PATENT DOCUMENTS

| | | | | |
|---|---|---|---|---|
| 5,544,006 | A * | 8/1996 | Radloff | G06F 1/186 |
| | | | | 361/756 |
| RE36,695 | E * | 5/2000 | Holt | G06F 1/184 |
| | | | | 174/67 |
| 6,618,263 | B1 * | 9/2003 | Kin-Wing | G06F 1/184 |
| | | | | 361/801 |
| 6,937,481 | B1 * | 8/2005 | Newman | H05K 7/1431 |
| | | | | 361/801 |
| 7,364,447 | B1 * | 4/2008 | Desrosiers | G06F 1/186 |
| | | | | 439/372 |
| 9,118,149 | B2 * | 8/2015 | Kappla | H01R 13/665 |
| 9,629,275 | B1 * | 4/2017 | Beall | G11B 33/128 |
| 9,763,351 | B1 * | 9/2017 | Ulrich | G06F 1/186 |
| 9,799,981 | B2 * | 10/2017 | Weber | H01R 13/502 |
| 10,079,451 | B2 * | 9/2018 | Henry | H01R 13/6335 |
| 10,109,941 | B1 * | 10/2018 | Li | H01R 13/665 |
| 10,177,476 | B1 * | 1/2019 | Phillips | H01R 12/79 |
| 10,354,699 | B1 * | 7/2019 | Gopalakrishna | G06F 1/181 |
| 2010/0002378 | A1 * | 1/2010 | Chen | G06F 1/186 |
| | | | | 361/679.58 |

(Continued)

*Primary Examiner* — Allen L Parker
*Assistant Examiner* — Martin Antonio Asmat Uceda
(74) *Attorney, Agent, or Firm* — Terrile, Cannatti & Chambers, LLP; Stephen A. Terrile

(57) ABSTRACT

A bottom system of storage system. The bottom system includes a bottom component; a storage card, the storage card being configured to be mounted within the bottom component; and, a card removal device mounted within the bottom component, the card removal device comprising a base portion; and, a pull tab component, the pull tab component being configured such that when the pull tab component is actuated, the pull tab component extends and lifts the storage card to remove the storage card from the bottom component of the storage system.

15 Claims, 12 Drawing Sheets

(56)     References Cited

U.S. PATENT DOCUMENTS

| | | | |
|---|---|---|---|
| 2014/0203581 A1* | 7/2014 | Baker ........................ | A45F 5/00 |
| | | | 294/137 |
| 2016/0018859 A1* | 1/2016 | Mao ..................... | H05K 7/1405 |
| | | | 211/41.17 |
| 2019/0079890 A1* | 3/2019 | Matula ................ | G06F 13/4045 |
| 2024/0128685 A1* | 4/2024 | Balakrishnan ..... | H01R 13/6275 |

* cited by examiner

100

SERVER SYSTEM STORAGE SYSTEM STORAGE MODULE

BACKGROUND OF THE INVENTION

Field of the Invention

The present invention relates to information handling systems. More specifically, embodiments of the invention relate to server type information handling systems within information technology (IT) environments.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

It is known to use information handling systems and related IT systems within information technology (IT) environments such as data centers.

SUMMARY OF THE INVENTION

A system and method for providing a storage system with a card removal device via which a card can be toollessly removed from a storage component of the storage system.

In one embodiment, the invention relates to a card removal device for use with a storage system for an information handling system, comprising: a base portion; and, a pull tab component, the pull tab component being configured such that when the pull tab component is actuated, the pull tab component extends and lifts a card of the storage system to remove the card from a bottom component of the storage system.

In another embodiment, the invention relates to a bottom system of a storage system comprising: a bottom component; a storage card, the storage card being configured to be mounted within the bottom component; and, a card removal device mounted within the bottom component, the card removal device comprising a base portion; and, a pull tab component, the pull tab component being configured such that when the pull tab component is actuated, the pull tab component extends and lifts a card of the storage system to remove the card from a bottom component of the storage system.

In another embodiment, the invention relates to a system comprising: a chassis; a processor contained within the chassis; a data bus coupled to the processor; and, a storage system comprising a bottom system, the bottom system comprising a bottom component; a storage card, the storage card being configured to be mounted within the bottom component; and, a card removal device mounted within the bottom component, the card removal device comprising a base portion; and, a pull tab component, the pull tab component being configured such that when the pull tab component is actuated, the pull tab component extends and lifts a card of the storage system to remove the card from a bottom component of the storage system.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Figure 1:
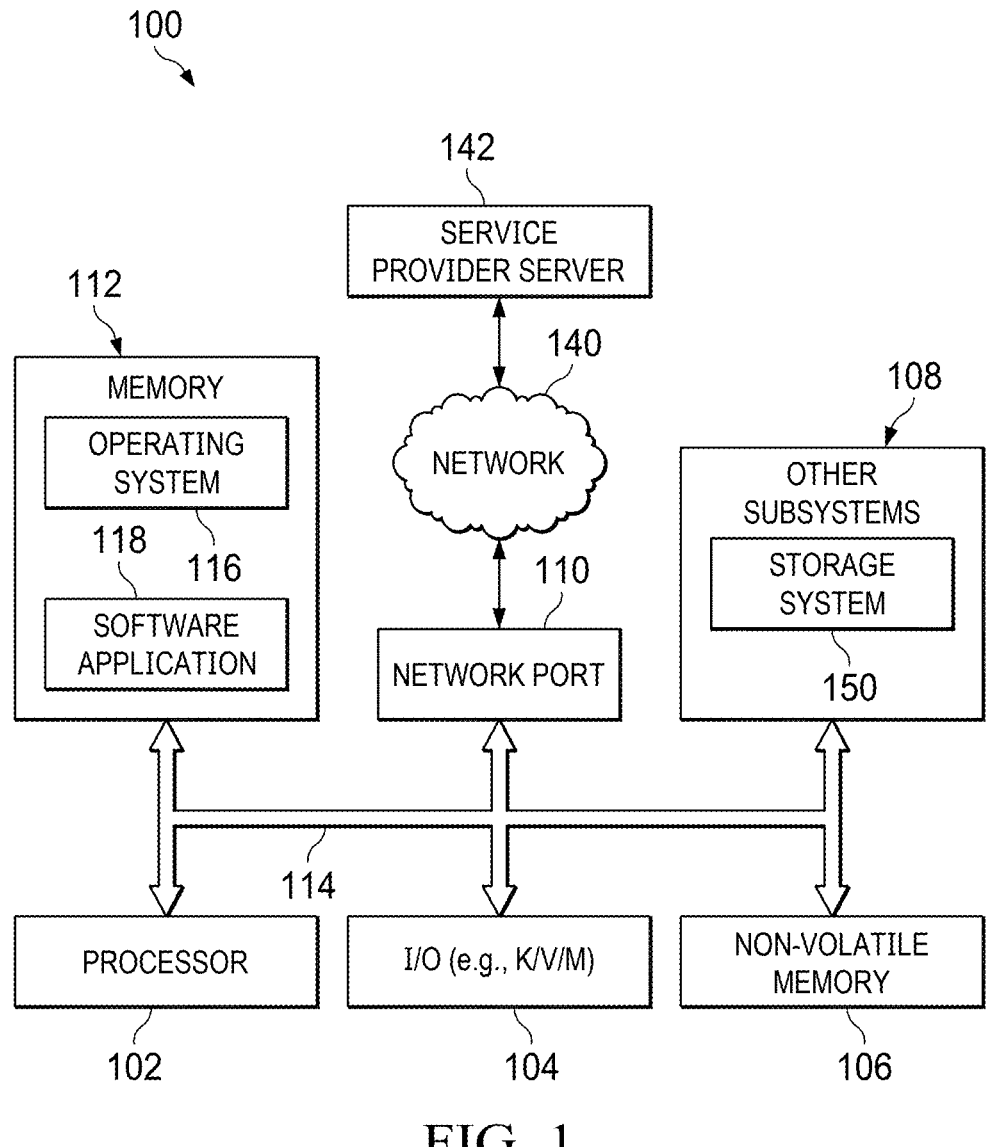
FIG. 1 shows a general illustration of components of an information handling system as implemented in the system and method of the present invention.

Various aspects of the disclosure include an appreciation that it is known to provide information handling systems with storage systems such as boot optimized storage systems. Various aspects of the disclosure include an appreciation that it is known to storage systems, such as boot optimized storage systems, which are hot swappable. Various aspects of the present disclosure include an appreciation that it is known to provide storage systems which can mount a plurality of storage components. Various aspects of the present disclosure include an appreciation that each of the plurality of storage components can include one or more storage devices. Various aspects of the present disclosure include an appreciation that the one or more storage devices often conform to particular storage device specifications. Various aspects of the present disclosure include an appreciation that one such storage device specification is the M.2 storage device specification. Various aspects of the present disclosure include an appreciation that storage device specification often defines particular dimensions for cards, such as internal memory cards, for the cards to conform to the storage device specification. Various aspects of the present disclosure include an appreciation the particular dimensions defined by a storage device specification can include areas defined as keep out zones.

Various aspects of the present disclosure include an appreciation that certain known storage components use a thermal pad when a card is mounted within the storage component. Various aspects of the present disclosure include an appreciation that the card is often adhered to a portion of the storage component via the thermal pad.

Various aspects of the present disclosure include an appreciation that it can be necessary to remove a card from the storage component, such as when there is some sort of repair needed for the storage component. Various aspects of the present disclosure include an appreciation that it can be challenging to remove a card once the card is adhered within the storage component such as via the thermal pad. Various aspects of the present disclosure include an appreciation that certain cards include areas which should not be touched (sometimes referred to as a keep out zone (KOZ)) during a removal process.

Accordingly, various aspects of the present disclosure include an appreciation that it would be desirable to provide a storage system with a card removal device via which a card can be toollessly removed from a storage component of the storage system.

A system and method are disclosed for providing a storage system with a card removal device via which a card can be toollessly removed from a storage component of the storage system. In certain embodiments, the card removal device includes a foldable pull tab. In certain embodiments, a base portion of the foldable pull tab is affixed to an inside wall of a bottom component of a storage system. In certain embodiments, when the pull tab is actuated (e.g., pulled), the foldable pull tab extends and lifts the card to remove the card from the bottom component. In certain embodiments, the foldable pull tab is positioned so as to not interfere with a keep out zone of the card. In certain embodiments, as the foldable pull tab extends, the pull tab interacts with an edge of the card to help a user access side edges of the card. In certain embodiments, in both a folded orientation and an unfolded orientation, the foldable pull tab does not interfere with the keep out zone of the card.

In certain embodiments, the storage system comprises a boot optimized storage system. In certain embodiments, the boot optimized storage system comprises a redundant array of independent disks (RAID) solution optimized for booting an operating system of a server. In certain embodiments, the boot optimized storage system comprises a plurality of serial advanced technology advancement (SATA) solid state devices (SSDs), a host interface (such as a PCIe host interface), a device interface (such as a SATA device interface), or a combination thereof. In certain embodiments, the solid state devices are included within a storage card. In certain embodiments, the storage card corresponds to an M.2 type storage card.

FIG. 1 shows a generalized illustration of an information handling system 100 that can be used to implement the system and method of the present invention. The information handling system 100 includes a processor (e.g., central processor unit or "CPU") 102, input/output (I/O) devices 104, such as a display, a keyboard, a mouse, and associated controllers, a hard drive or disk storage 106, and various other subsystems 108. In various embodiments, the information handling system 100 also includes network port 110 operable to connect to a network 140, which is likewise accessible by a service provider server 142. In various embodiments, one or both the other subsystems 108 or the network port 110 include storage system 150. The information handling system 100 likewise includes system memory 112, which is interconnected to the foregoing via one or more buses 114. System memory 112 further comprises operating system (OS) 116. In certain embodiments, the information handling system 100 is one of a plurality of information handling systems within a data center. In certain embodiments, the information handling system 100 comprises a server type information handling system. In certain embodiments, the server type information handling system is configured to be mounted within a server rack. In certain embodiments, the other subsystem 108 includes one or more power supplies for supplying power to the other components of the information handling system 100.

In certain embodiments, the information handling system 100 comprises a server type information handling system. In certain embodiments, the server type information handling system comprises a blade server type information handling system. As used herein, a blade server type information handling system broadly refers to an information handling system which is physically configured to be mounted within a server rack.

In certain embodiments, the storage system 150 comprises a storage system housing which includes a card removal device via which a card can be toollessly removed from a storage component of the storage system. In certain embodiments, the card removal device includes a foldable pull tab. In certain embodiments, a base portion of the foldable pull tab is affixed to an inside wall of a bottom component of a storage system. In certain embodiments, when the pull tab is actuated (e.g., pulled), the foldable pull tab extends and lifts the card to remove the card from the bottom component. In certain embodiments, the foldable pull tab is positioned so as to not interfere with a keep out zone of the card. In certain embodiments, as the foldable pull tab extends, the pull tab interacts with an edge of the card to help a user access side edges of the card. In certain embodiments, in both a folded orientation and an unfolded orientation, the foldable pull tab does not interfere with the keep out zone of the card.

In certain embodiments, the storage system comprises a boot optimized storage system. In certain embodiments, the boot optimized storage system comprises a redundant array of independent disks (RAID) solution optimized for booting an operating system of a server. In certain embodiments, the boot optimized storage system comprises a plurality of serial advanced technology advancement (SATA) solid state devices (SSDs), a host interface (such as a PCIe host interface), a device interface (such as a SATA device interface), or a combination thereof. In certain embodiments, the solid state devices are included within a storage card. In certain embodiments, the storage card corresponds to an M.2 type storage card.

Figure 2:
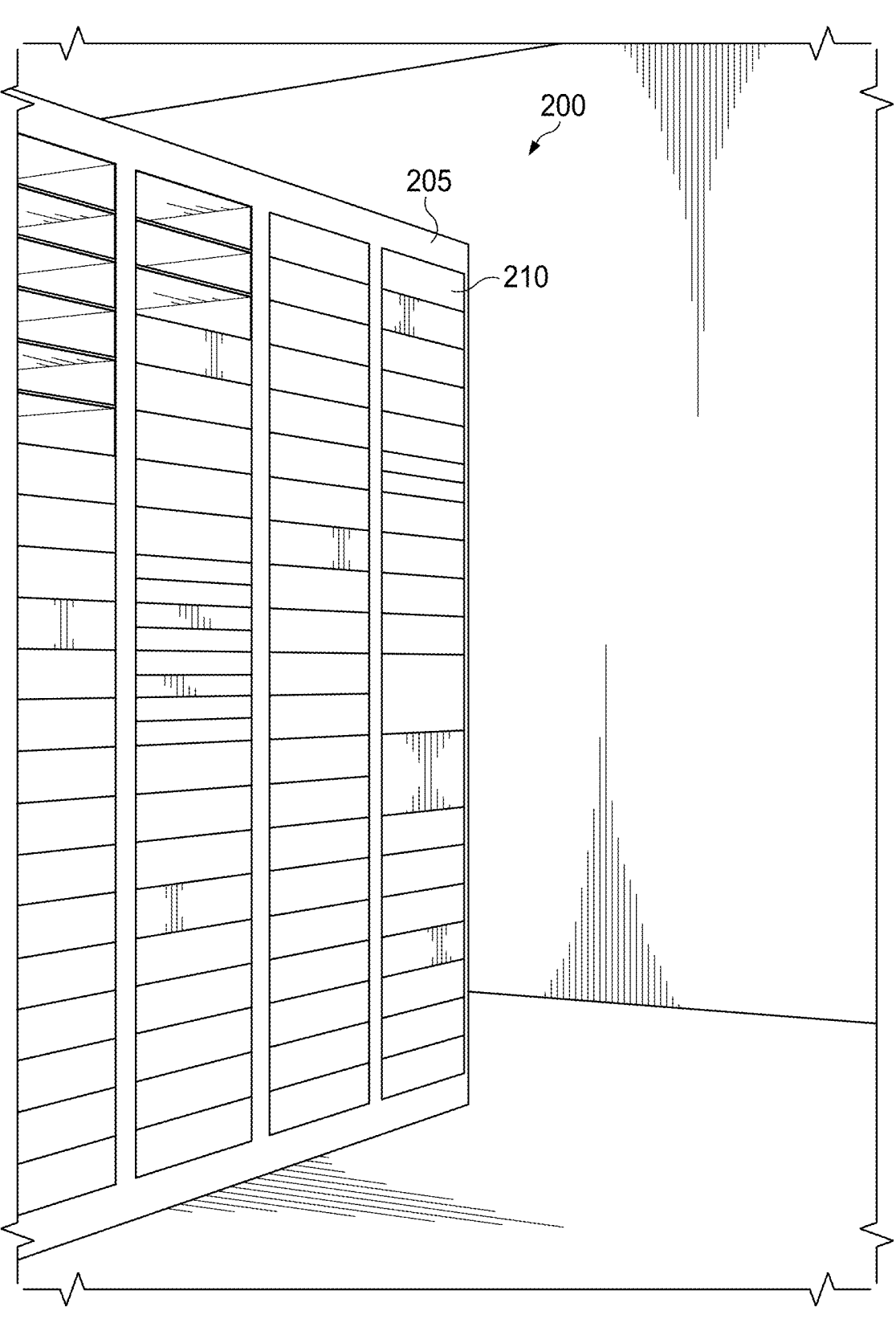
FIG. 2 shows a perspective view of a portion of a data center within an IT environment.

FIG. 2 shows a perspective view of a portion of an IT environment 200. The IT environment includes one or more racks 205 which include a plurality of information handling systems 100, often referred to as a server rack. In various embodiments, the IT environment 200 comprises a data center. As used herein, a data center refers to an IT environment which includes a plurality of networked information handling systems 100. In various embodiments, the information handling systems 100 of the data center include some or all of router type information handling systems, switch type information handling systems, firewall type information handling systems, storage system type information handling systems, server type information handling systems and application delivery controller type information handling systems. In certain environments, the information handling systems 100 are mounted within respective racks. As used herein, a rack refers to a physical structure that is designed to house the information handling systems 100, as well as the associated cabling and power provision for the information handling systems. In certain embodiments, a rack includes side panels to which the information handling systems are mounted. In certain embodiments, the rack includes a top panel and a bottom panel to which the side panels are attached. In certain embodiments, the side panels each include a front side panel and a rear side panel.

In certain embodiments, a plurality of racks is arranged continuous with each other to provide a rack system. An IT environment can include a plurality of rack systems arranged in rows with aisles via which IT service personnel can access information handling systems mounted in the racks. In certain embodiments, the aisles can include front aisles via which the front of the information handling systems may be accessed and hot aisles via which the infrastructure (e.g., data and power cabling) of the IT environment can be accessed.

Each respective rack includes a plurality of vertically arranged information handling systems 210. In certain embodiments, the information handling systems may conform to one of a plurality of standard server sizes. In certain embodiments, the plurality of server sizes conforms to particular rack unit sizes (i.e., rack units). As used herein, a rack unit broadly refers to a standardized server system height. As is known in the art, a server system height often conforms to one of a 1 U rack unit, a 2 U rack unit, and a 4 U rack unit. In general, a 1 U rack unit is substantially (i.e., +/−20%) 1.75" high, a 2 U rack unit is substantially (i.e., +/−20%) 3.5" high, and a 4 U rack height is substantially (i.e., +/−20%) 7.0" high.

Figure 3:
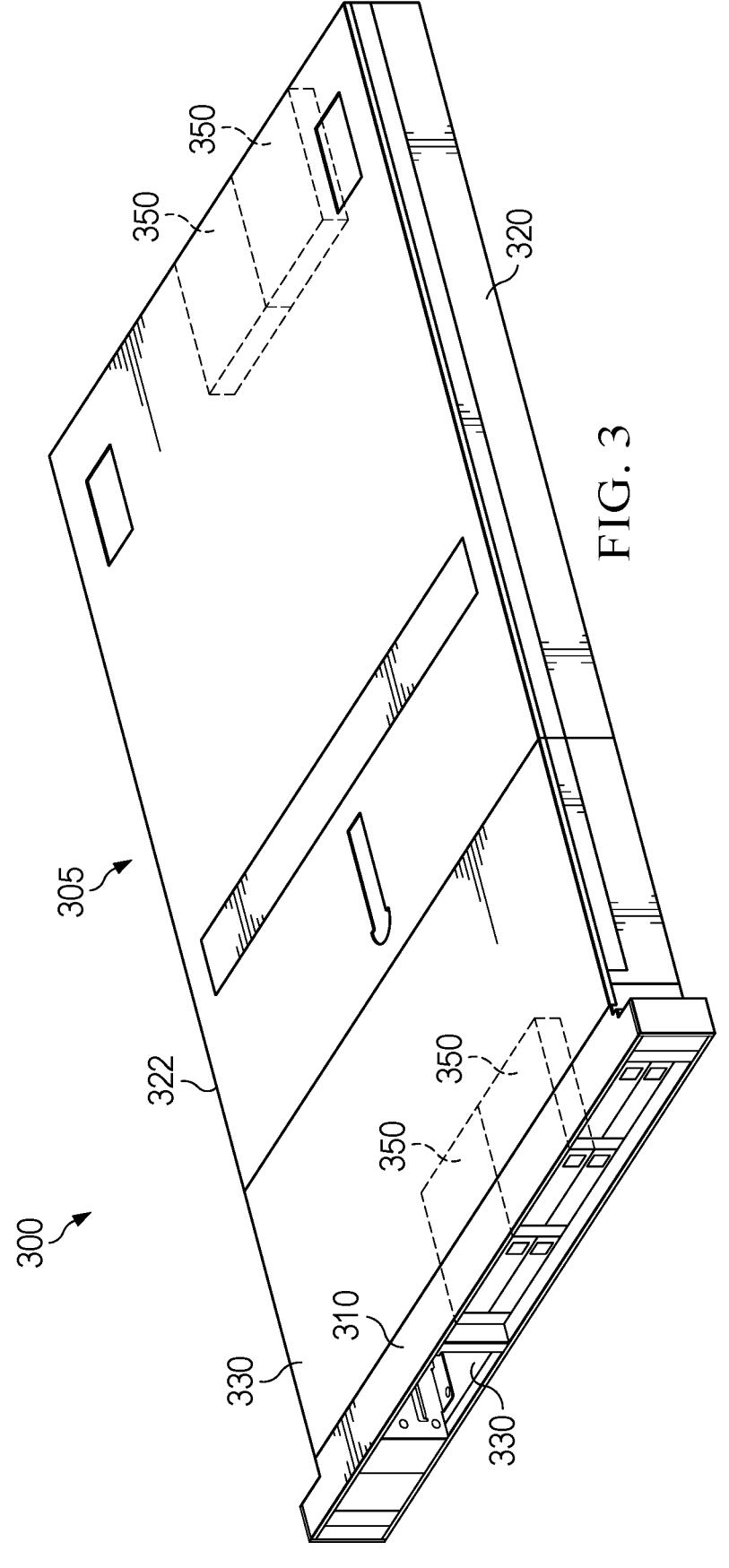
FIG. 3 shows a generalized perspective view of an example server type information handling system.

FIG. 3 shows a generalized perspective view of an example blade server type information handling system 300 which includes a chassis 305. In certain embodiments, the server type information handling system includes a front portion 310, which is accessible when the server type information handing system 300 is mounted on a server rack. In certain embodiments, the side portions 320, 322 mount to the rack via respective server mounting components. In certain embodiments, the side portions mount to the rack via respective mechanical guiding features which are mechanically coupled to respective server mounting components. In certain embodiments, the server type information handling system can slide out from the rack via the respective mechanical guiding features. In certain embodiments, internal components of the blade type information handling system 300 may be accessed by removing a top panel 330 of the blade type information handing system 300. In certain embodiments, the blade type information handing system 300 includes a bay 350 via which components may be mounted to the blade type information handling system. In certain embodiments, components mounted in one or more of the bays 310 include a storage system 350.

In certain embodiments, the storage system comprises a boot optimized storage system. In certain embodiments, the boot optimized storage system comprises a redundant array of independent disks (RAID) solution optimized for booting an operating system of a server. In certain embodiments, the boot optimized storage system comprises a plurality of serial advanced technology advancement (SATA) solid state devices (SSDs), a host interface (such as a PCIe host interface), a device interface (such as a SATA device interface), or a combination thereof. In certain embodiments, the solid state devices are included within a storage card. In certain embodiments, the storage card corresponds to an M.2 type storage card.

Figure 4:
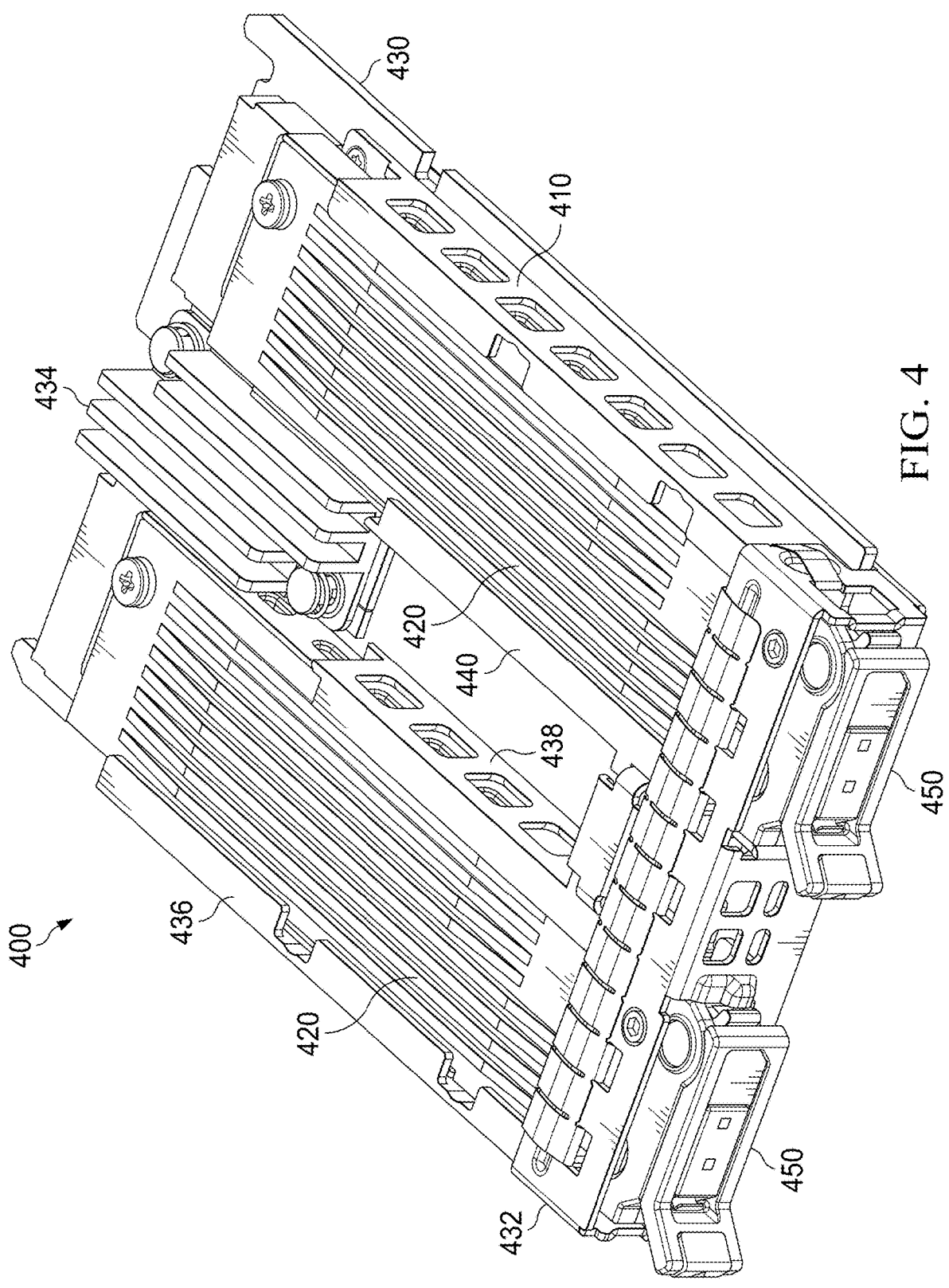
FIG. 4 shows a storage system with a plurality of storage cartridges.

FIG. 4 shows a storage system 400 with a plurality of latching systems 405. In certain embodiments, the storage system 400 corresponds to storage system 150. In certain embodiments, each latching system 405 includes a latching mechanism and a latch engagement portion.

In certain embodiments, the storage system 400 corresponds to storage system 150. In certain embodiments the storage module housing 410 includes a bottom wall 430, a front housing portion 432, an outside right wall 434, an outside left wall 436, an inside right wall 438, an inside left wall 440, or a combination thereof.

In certain embodiments, the housing portion 432 extends substantially perpendicularly (i.e., +/−20%) from the bottom wall 430. In certain embodiments, the front wall extends substantially perpendicularly (i.e., +/−20%) from the bottom wall 430. In certain embodiments, the outside right wall 434 extends substantially perpendicularly (i.e., +/−20%) from the bottom wall 430. In certain embodiments, the outside left wall 436 extends substantially perpendicularly (i.e., +/−20%) from the bottom wall 430. In certain embodiments, the right inside wall 438 extends substantially perpendicularly (i.e., +/−20%) from the bottom wall 430. In certain embodiments, the left inside wall 440 extends substantially perpendicularly (i.e., +/−20%) from the bottom wall 430. It will be appreciated that the orientations of the walls will be reversed when the storage system is installed at the rear of the information handling systems (e.g., the front housing portion 432 is effectively a rear housing portion).

In certain embodiments, the front housing portion 432 defines one or more apertures via which storage cartridge modules 420 may be installed in the storage module housing 410. In certain embodiments, pairs of left and right walls (e.g., a left outside wall and a right inside wall) include channels via which respective storage cartridges may be inserted and mounted to the storage module housing 410. In certain embodiments, the left and right walls include channels via which respective storage cartridges may be inserted and mounted to the storage module housing 410. In certain embodiments, the outside right wall 434 and the inside left wall 440 define channels via which a storage cartridge module 420 may be installed in the storage module housing 410. In certain embodiments, the outside left wall 436 and the inside right wall 438 define channels via which a storage cartridge module 420 may be installed in the storage module housing 410.

In certain embodiments, when the storage cartridge module 420 is configured in a hot swap storage media access configuration, each storage cartridge module 420 includes a respective latch 450 which allows a user to unlatch the storage cartridge module and remove the storage cartridge module from the storage system.

Figure 5:
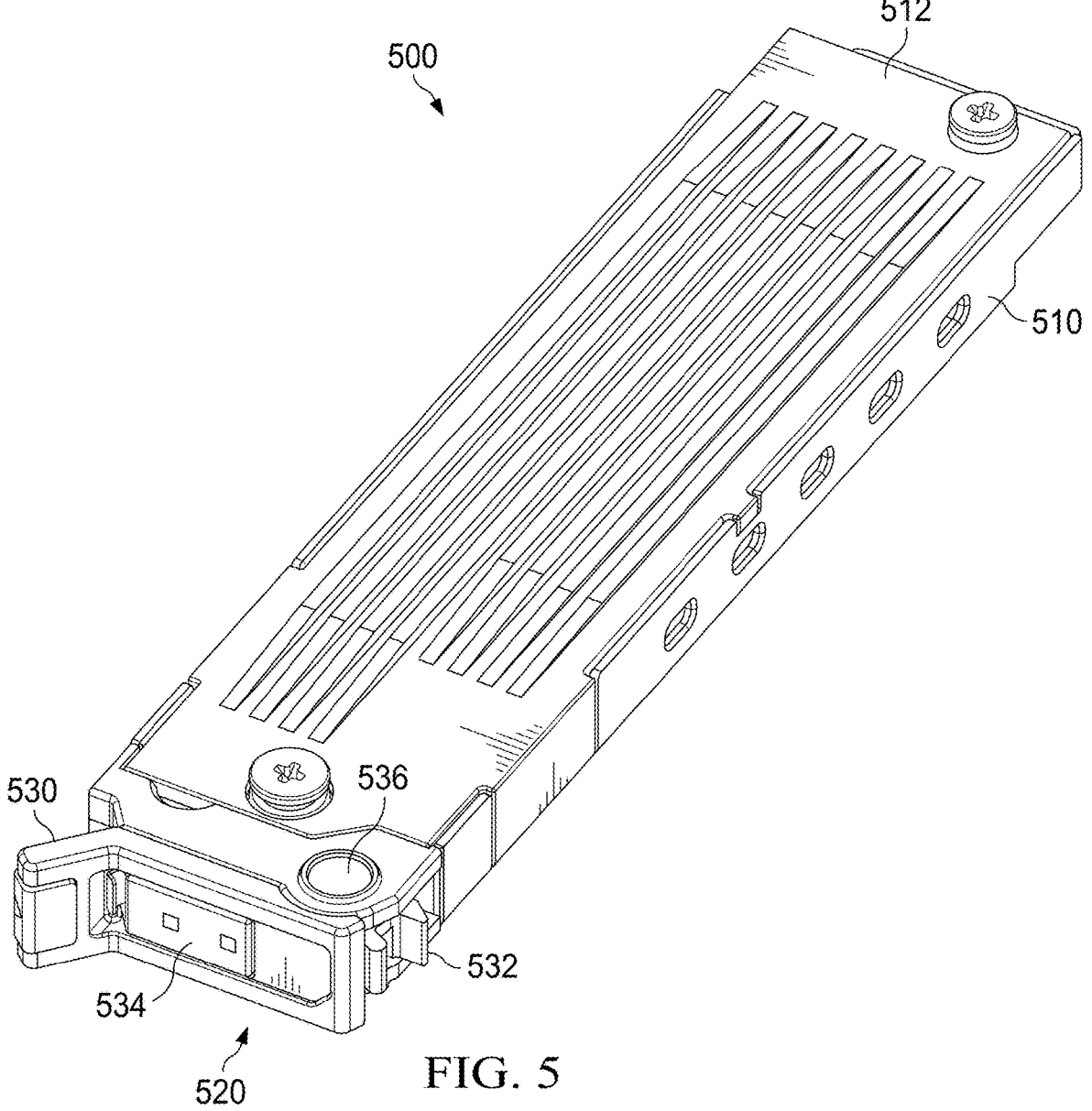
FIG. 5 shows a perspective view of a storage cartridge of a storage system.

FIG. 5 shows a perspective view of a storage cartridge 500 of a storage system. In certain embodiments, the storage cartridge module 500 corresponds to storage cartridge module 420. In certain embodiments, the storage system corresponds to storage system 150.

In certain embodiments the storage cartridge module 500 includes a bottom component 510 and a top cover 512. In certain embodiments, the bottom component 510 and the top cover 512 are configured to receive a latch component 530. In certain embodiments, the bottom component 510 defines an attachment aperture, includes an attachment component, or a combination thereof. In certain embodiments, the attachment component includes a nut. In certain embodiments, the attachment aperture, the attachment component, or a combination thereof, are used to attach a latch component 530 to the storage cartridge module 500. In certain embodiments, the attachment component mates with a fastener to mount the top cover 512 to the bottom component 510.

In certain embodiments, a latch mechanism includes a latch hook portion 532. In certain embodiments, the latch 530 and the latch hook portion 532, or a combination thereof are included within a latch mechanism. In certain embodiments, the latch hook portion 532 is configured to interact with a latch engagement portion.

Figure 6A:
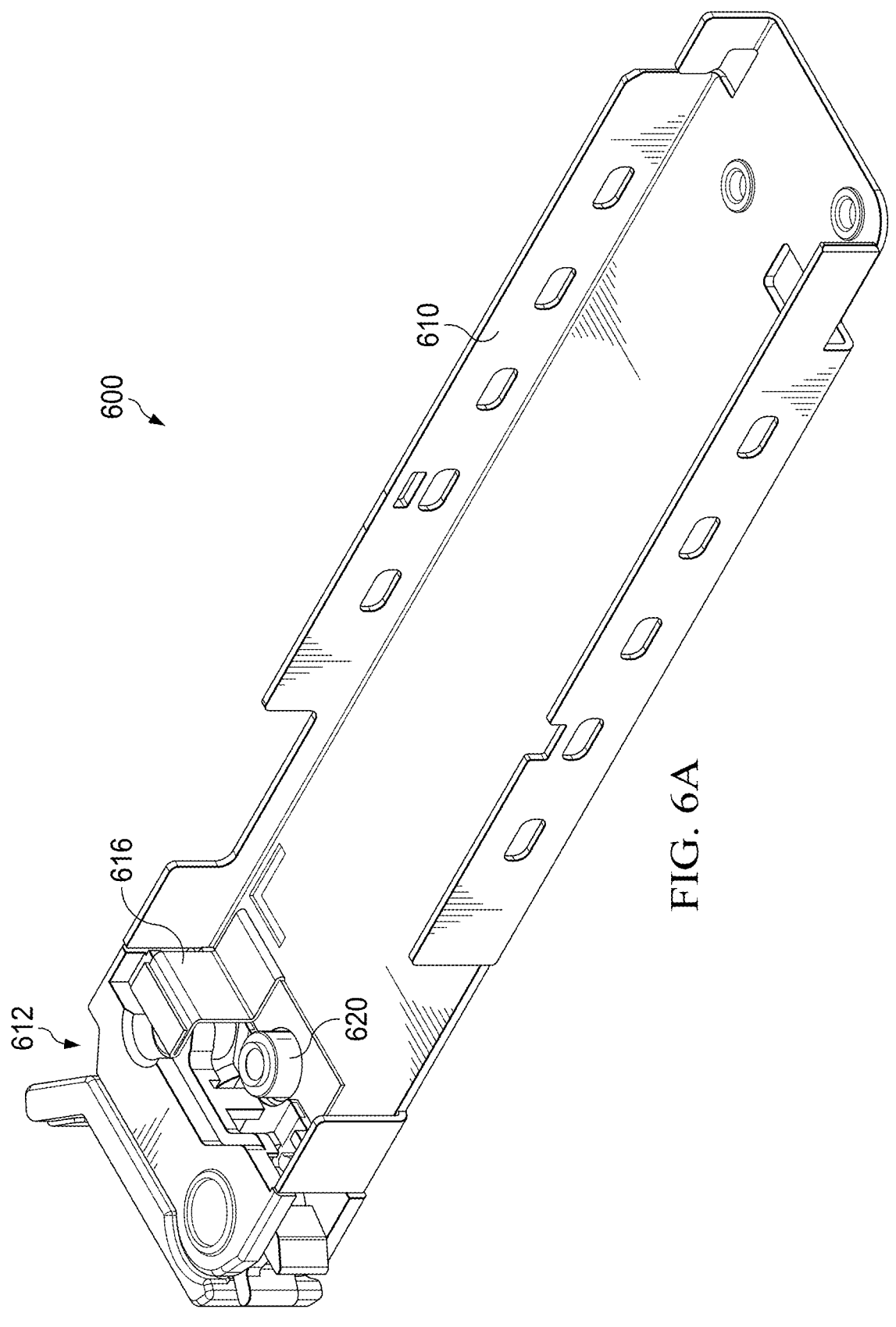
FIGS. 6A, 6B, 6C, 6D 6E, generally referred to as FIG. 6, show a plurality of views of a bottom storage component bottom system.
Figure 6B:
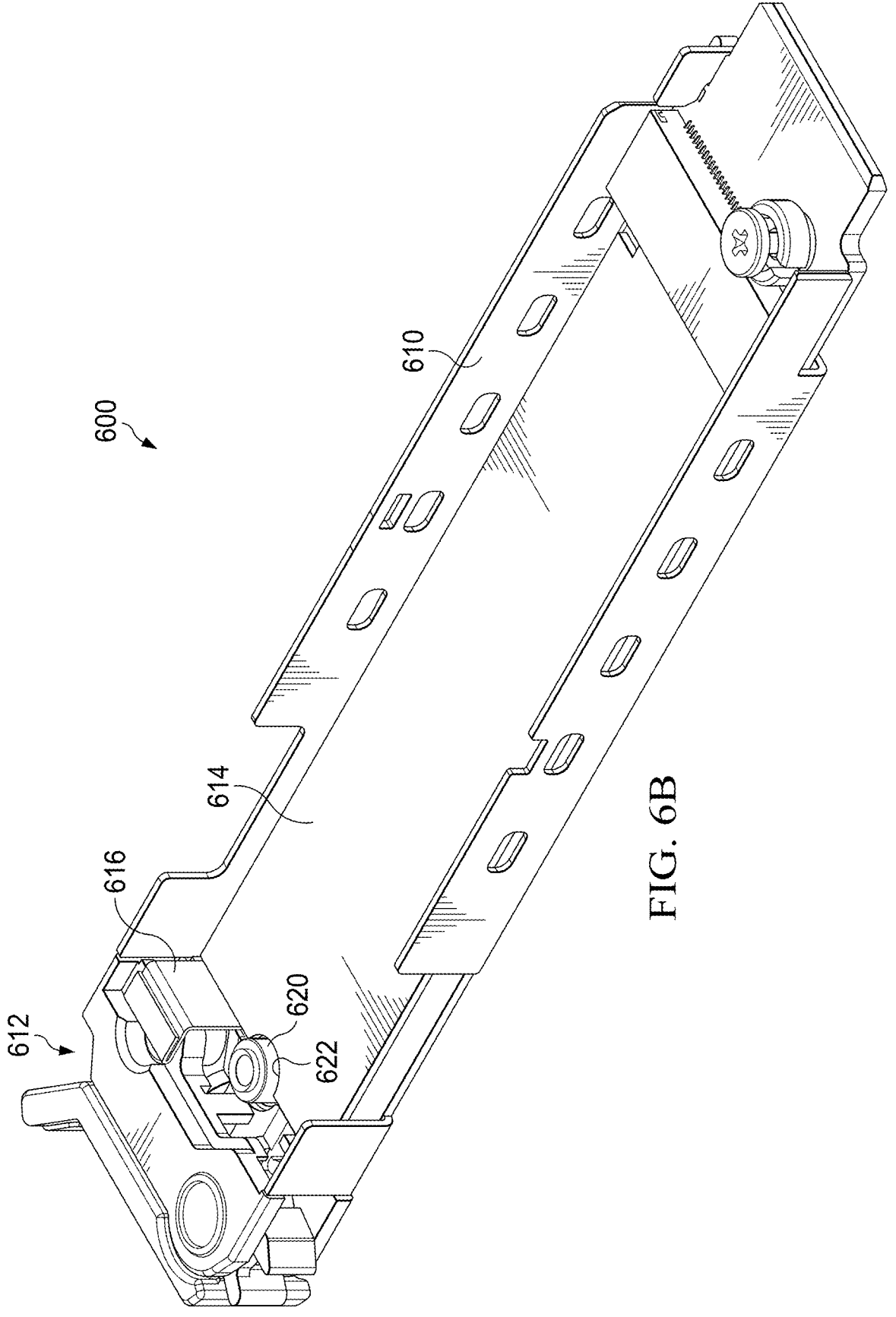
Figure 6C:
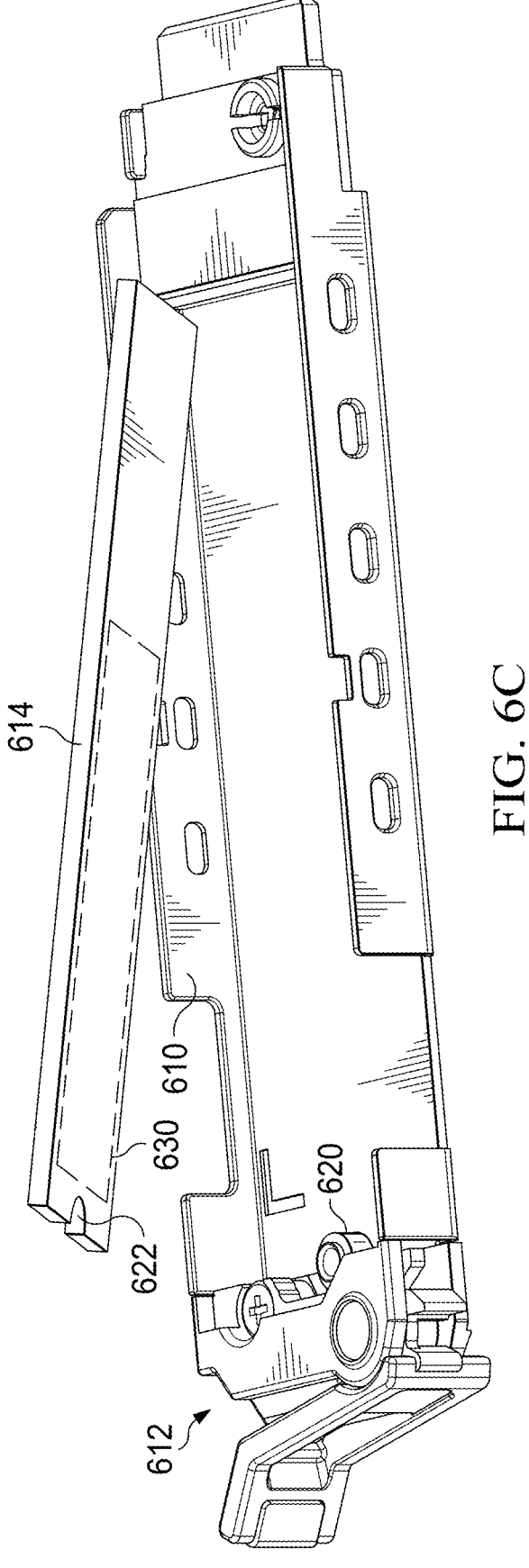
Figure 6D:
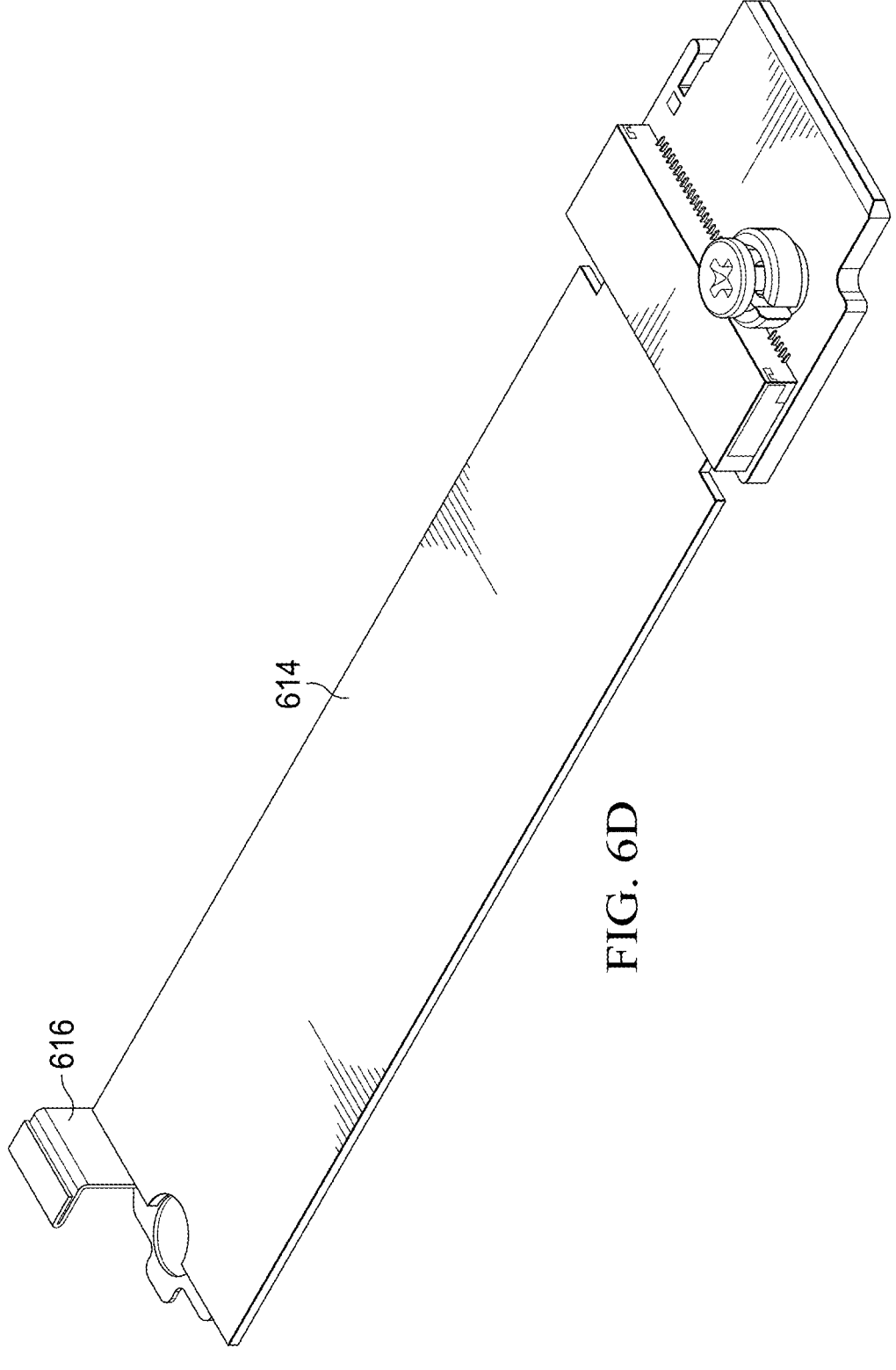

FIGS. 6A, 6B, 6C and 6D, generally referred to as FIG. 6, show a plurality of views of a storage component bottom system 600. More specifically, FIG. 6A shows a perspective view of a bottom system 600 without a card installed. FIG. 6B shows a perspective view of a bottom system 600 along with an installed card. FIG. 6C shows a perspective view of a card and a bottom component. FIG. 6D shows a perspective view of a card, a card removal tab and a card connector. FIG. 6E shows perspective view of a storage component bottom system as a card is removed from the bottom component.

In certain embodiments, the bottom system 600 includes a bottom component 610, a latch component 612, a card 614, a card removal device 616, a card connector 618, or a combination thereof. In certain embodiments, the bottom component 610 corresponds to bottom component 510. In certain embodiments, the card removal device 616 is configured to include a foldable pull tab.

In certain embodiments, the bottom component 610 includes a card alignment projection 620. In certain embodiments, the card alignment projection 620 is affixed to an inside wall of the bottom component 610. In certain embodiments, the card 614 includes a card alignment recess 622. In certain embodiments, the card alignment recess 622 mates with the card alignment projection 620 when the card is mounted to the card connector 618.

In certain embodiments, a base portion of the card removal device 616 is affixed to an inside wall of the bottom component 610 of a storage system. In certain embodiments, the base portion of the card removal device 616 defines an aperture. In certain embodiments, the aperture fits over the card alignment projection 620 when the base portion of the card removal device 616 is affixed to the inside wall of the bottom component 610 of the storage system. In certain embodiments, the foldable pull tab is positioned to a side of the base of portion of the card removal device. In certain embodiments, the foldable pull tab is positioned to a side of the base of portion of the card removal device relative to the aperture of the card removal device 616.

Figure 6E:
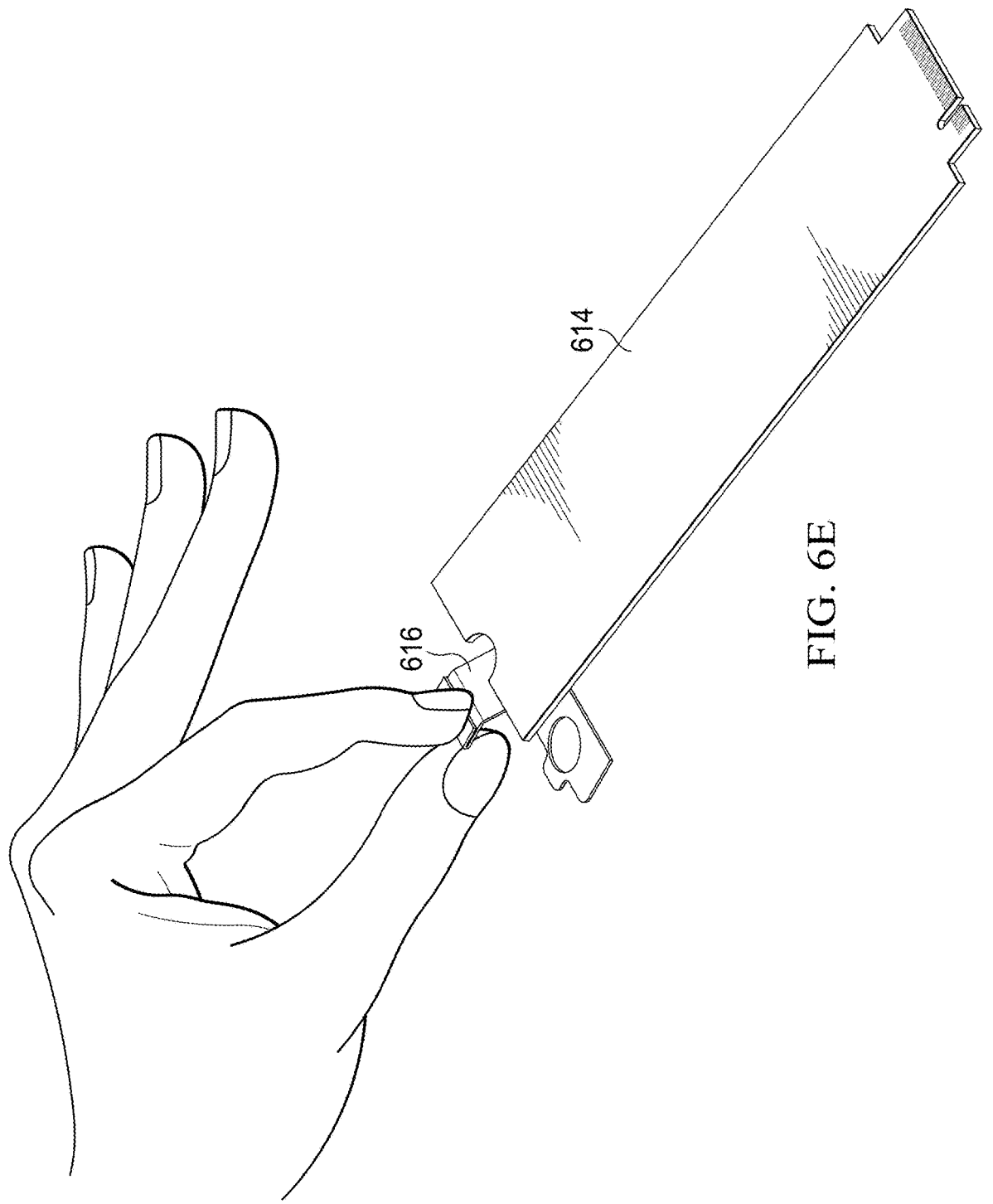

In certain embodiments, when the pull tab is actuated (e.g., pulled), the foldable pull tab extends and lifts the card 614 to remove the card from the bottom component 610 (see e.g., FIG. 6E). In certain embodiments, as the foldable pull tab extends, the pull tab interacts with an edge of the card to help a user access side edges of the card.

In certain embodiments, the card 614 includes a predefined keep out zone 630 (see e.g., FIG. 6C). In certain embodiments, the predefined keep out zone 630 is located on a bottom layer of the card 614. In certain embodiments, the keep out zone is defined by a storage system specification. In certain embodiments, the keep out zone is located on the layer of the card 614 via which the card 614 is mounted to the bottom component 616. In certain embodiments, the keep out zone 630 is substantially rectangularly shaped. In certain embodiments, the keep out zone 630 is designed to prevent any conductive surfaces contained under the keep out zone from being exposed and potentially causing a short circuit. In certain embodiments, the card removal device 616 is sized and positioned so as to not interfere with a keep out zone of the card. In certain embodiments, in both a folded orientation and an unfolded orientation, the card removal device 616 does not interfere with the keep out zone of the card.

Figure 7A:
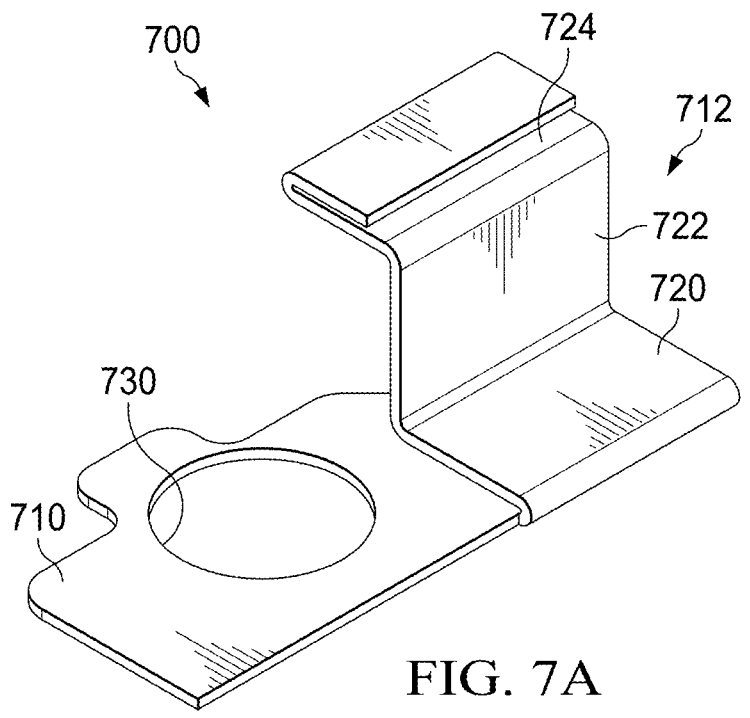
FIGS. 7A and 7B, generally referred to as FIG. 7, show a card removal tab.
Figure 7B:
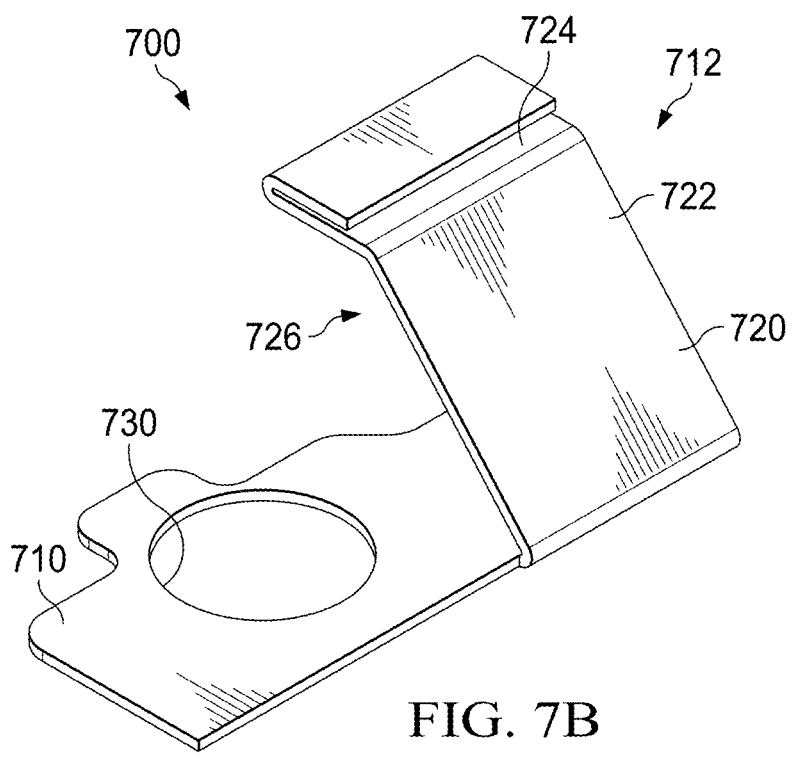

FIGS. 7A and 7B, generally referred to as FIG. 7, show a card removal device 700. In certain embodiments, the card removal device 700 corresponds to card removal device 616. In certain embodiments, the card removal device 700 includes a base portion 710, a foldable pull tab component 712, or a combination thereof. In certain embodiments, the base portion 710 and the foldable pull tab component 712 are configured from a single piece of material. In certain embodiments, the foldable pull tab component 712 includes a pull tab base portion 720, a pull tab vertical wall portion 722, a pull tab top wall portion 724, or a combination thereof. In certain embodiments, the pull tab base portion 720 is pivotably coupled with the base portion 710 along an outside edge of the pull tab base portion 720. In certain embodiments, the pull tab vertical portion 722 is pivotally coupled with the pull tab base portion 720 along a bottom edge of the pull tab vertical portion 722 and an inside edge of the pull tab base portion 720. In certain embodiments, the pull tab top wall portion 724 is pivotally coupled with the pull tab vertical portion 722 along an inside edge of the pull tab top portion 724 and a top edge of the pull tab vertical portion 722.

In certain embodiments, when the pull tab is actuated (e.g., by pulling to pull tab top wall portion 724), the foldable pull tab extends and lifts the card to remove the card from the bottom component. In certain embodiments, as the foldable pull tab extends, the pull tab interacts with an edge of the card to help a user access side edges of the card. In certain embodiments, when the pull tab is unextended so that the card removal device is in a closed open orientation, the pull tab base portion 720 lies substantially flat against the base portion 710. In certain embodiments, as the pull tab extends so that the card removal device is in an open orientation, the pull tab base portion 720 and the pull tab vertical wall portion 722 combine to provide an angled wall 726. In certain embodiments, the angled wall 726 lifts the card to remove the card from the bottom component. In certain embodiments, as the pull tab extends, the base portion 710 and the pull tab base portion 720 pivot along the outside edge of the pull tab base portion 720. In certain embodiments, as the pull tab extends, the pull tab base portion 720 and the pull tab vertical wall portion pivot along the bottom edge of the pull tab vertical portion 722 and the inside edge of the pull tab base portion 720. In certain embodiments, as the pull tab extends, the pull tab top wall portion 724 and the pull tab vertical wall portion 722 pivot along the inside edge of the pull tab top portion 724 and the top edge of the pull tab vertical portion 722.

In certain embodiments, the base portion 710 of the card removal device 700 is configured to be affixed to an inside wall of the bottom component of a storage system. In certain embodiments, the base portion of the card removal device 710 defines an aperture 730. In certain embodiments, the aperture 730 is configured to fit over a card alignment projection when the base portion of the card removal device 700 is affixed to an inside wall of a bottom component of the storage system. In certain embodiments, the pull tab component 712 is positioned to a side of the base of portion of the card removal device. In certain embodiments, the pull tab component 712 is positioned to a side of the base of portion of the card removal device relative to the aperture 730 of the card removal device 700.

Figure 8A:
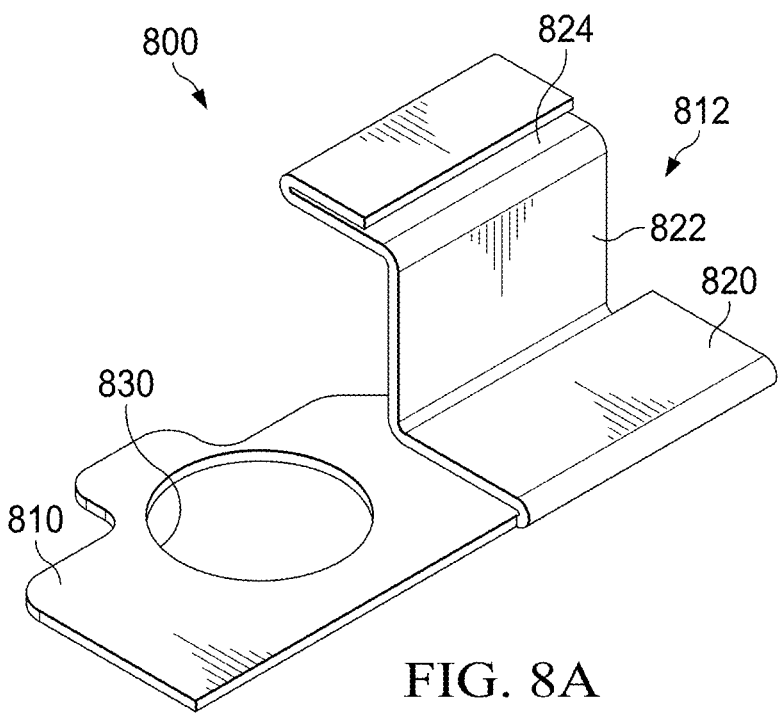
FIGS. 8A and 8B, generally referred to as FIG. 8, show another embodiment of a card removal tab.
Figure 8B:
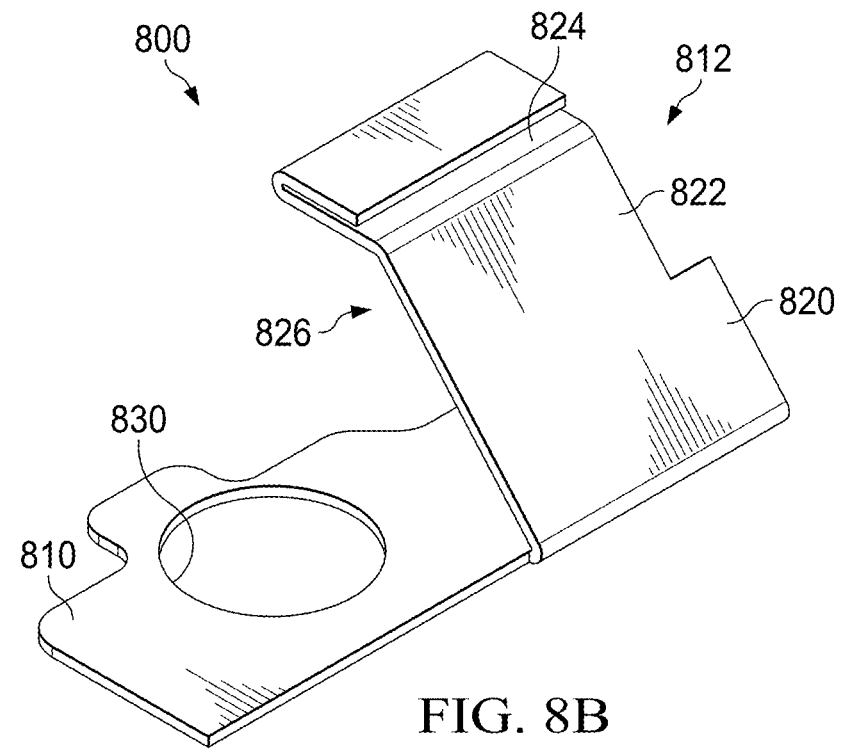

FIGS. 8A and 8B, generally referred to as FIG. 8, show another embodiment of a card removal device 800. In certain embodiments, the card removal device 800 corresponds to card removal device 616. In certain embodiments, the card removal device 800 includes a base portion 810, a foldable pull tab component 812, or a combination thereof. In certain embodiments, the base portion 810 and the foldable pull tab component 812 are configured from a single piece of material. In certain embodiments, the foldable pull tab component 812 includes a pull tab base portion 820, a pull tab vertical wall portion 822, a pull tab top wall portion 824, or a combination thereof. In certain embodiments, the pull tab base portion 820 is pivotably coupled with the base portion 810 along an outside edge of the pull tab base portion 820. In certain embodiments, the pull tab vertical portion 822 is pivotally coupled with the pull tab base portion 820 along a bottom edge of the pull tab vertical portion 822 and an inside edge of the pull tab base portion 820. In certain embodiments, the pull tab top wall portion 824 is pivotally coupled with the pull tab vertical portion 822 along an inside edge of the pull tab top portion 824 and a top edge of the pull tab vertical portion 822.

In certain embodiments, when the pull tab is actuated (e.g., by pulling to pull tab top wall portion 824), the foldable pull tab extends and lifts the card to remove the card from the bottom component. In certain embodiments, as the foldable pull tab extends, the pull tab interacts with an edge of the card to help a user access side edges of the card. In certain embodiments, when the pull tab is unextended so that the card removal device is in a closed open orientation, the pull tab base portion 820 lies substantially flat against the base portion 810. In certain embodiments, as the pull tab extends so that the card removal device is in an open orientation, the pull tab base portion 820 and the pull tab vertical wall portion 822 combine to provide an angled wall 826. In certain embodiments, the angled wall 826 lifts the card to remove the card from the bottom component. In certain embodiments, as the pull tab extends, the base portion 810 and the pull tab base portion 820 pivot along the outside edge of the pull tab base portion 820. In certain embodiments, as the pull tab extends, the pull tab base portion 820 and the pull tab vertical wall portion pivot along the bottom edge of the pull tab vertical portion 822 and the inside edge of the pull tab base portion 820. In certain embodiments, as the pull tab extends, the pull tab top wall portion 824 and the pull tab vertical wall portion 822 pivot along the inside edge of the pull tab top portion 824 and the top edge of the pull tab vertical portion 822.

In certain embodiments, the base portion 810 of the card removal device 800 is configured to be affixed to an inside wall of the bottom component of a storage system. In certain embodiments, the base portion of the card removal device 810 defines an aperture 830. In certain embodiments, the aperture 830 is configured to fit over a card alignment projection when the base portion of the card removal device 800 is affixed to an inside wall of a bottom component of the storage system. In certain embodiments, the pull tab component 812 is positioned to a side of the base of portion of the card removal device. In certain embodiments, the pull tab component 812 is positioned to a side of the base of portion of the card removal device relative to the aperture 830 of the card removal device 800.

The present invention is well adapted to attain the advantages mentioned as well as others inherent therein. While the present invention has been depicted, described, and is defined by reference to particular embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only, and are not exhaustive of the scope of the invention.

Consequently, the invention is intended to be limited only by the spirit and scope of the appended claims, giving full cognizance to equivalents in all respects.

What is claimed is:

1. A card removal device for use with a storage system for an information handling system, comprising: a base portion; and, a pull tab component, the pull tab component being configured such that when the pull tab component is actuated, the pull tab component extends and lifts a card of the storage system to remove the card from a bottom component of the storage system, the pull tab component including a pull tab base portion and a pull tab vertical wall portion and a pull tab top wall portion, the pull tab vertical portion being pivotally coupled with the pull tab base portion along a bottom edge of the pull tab vertical portion and an inside edge of the pull tab base portion.

2. The card removal device of claim 1, wherein: the pull tab top wall portion is pivotally coupled with the pull tab vertical portion along an inside edge of the pull tab top portion and a top edge of the pull tab vertical portion.

3. The card removal device of claim 1, wherein: as the pull tab component extends, the pull tab base portion and the pull tab vertical wall portion combine to provide an angled wall.

4. The card removal device of claim 1, wherein: the pull tab base portion defines an aperture, the aperture being configured to fit over a card alignment projection of the bottom component of the storage system.

5. The card removal device of claim 1, wherein: the card includes a predefined keep out zone; and, the pull tab component is sized so as to not interfere with a keep out zone of the card.

6. A bottom system of a storage system comprising: a bottom component; a storage card, the storage card being configured to be mounted within the bottom component; and, a card removal device mounted within the bottom component, the card removal device comprising a base portion; and, a pull tab component, the pull tab component being configured such that when the pull tab component is actuated, the pull tab component extends and lifts the storage card to remove the storage card from the bottom component of the storage system, the pull tab component including a pull tab base portion and a pull tab vertical wall portion and a pull tab top wall portion, the pull tab vertical portion being pivotally coupled with the pull tab base portion along a bottom edge of the pull tab vertical portion and an inside edge of the pull tab base portion.

7. The bottom system of claim 6, wherein: the pull tab top wall portion is pivotally coupled with the pull tab vertical portion along an inside edge of the pull tab top portion and a top edge of the pull tab vertical portion.

8. The bottom system of claim 6, wherein: as the pull tab component extends, the pull tab base portion and the pull tab vertical wall portion combine to provide an angled wall.

9. The bottom system of claim 6, wherein: the pull tab base portion defines an aperture, the aperture being configured to fit over a card alignment projection of the bottom component of the storage system.

10. The bottom system of claim 6, wherein: the storage card includes a predefined keep out zone; and, the pull tab component is sized so as to not interfere with a keep out zone of the storage card.

11. A system comprising: a chassis; a processor contained within the chassis; a data bus coupled to the processor; and, a storage system comprising a bottom system, the bottom system comprising a bottom component; a storage card, the storage card being configured to be mounted within the bottom component; and, a card removal device mounted within the bottom component, the card removal device comprising a base portion; and, a pull tab component, the pull tab component being configured such that when the pull tab component is actuated, the pull tab component extends and lifts the storage card to remove the storage card from the bottom component of the storage system, the pull tab component including a pull tab base portion and a pull tab vertical wall portion and a pull tab top wall portion, the pull tab vertical portion being pivotally coupled with the pull tab base portion along a bottom edge of the pull tab vertical portion and an inside edge of the pull tab base portion.

12. The system of claim 11, wherein: the pull tab top wall portion is pivotally coupled with the pull tab vertical portion along an inside edge of the pull tab top portion and a top edge of the pull tab vertical portion.

13. The system of claim 11, wherein: as the pull tab component extends, the pull tab base portion and the pull tab vertical wall portion combine to provide an angled wall.

14. The system of claim 11, wherein: the pull tab base portion defines an aperture, the aperture being configured to fit over a card alignment projection of the bottom component of the storage system.

15. The system of claim 11, wherein: the storage card includes a predefined keep out zone; and, the pull tab component is sized so as to not interfere with a keep out zone of the storage card.

*    *    *    *    *